(12) United States Patent
Aratake

(10) Patent No.: US 6,407,485 B1
(45) Date of Patent: Jun. 18, 2002

(54) PIEZOELECTRIC VIBRATOR

(75) Inventor: Kiyoshi Aratake, Chiba (JP)

(73) Assignee: Seiko Instruments, Inc. (JP)

( * ) Notice: Subject to any disclaimer, the term of this patent is extended or adjusted under 35 U.S.C. 154(b) by 0 days.

(21) Appl. No.: 09/493,760

(22) Filed: Jan. 28, 2000

(30) Foreign Application Priority Data

Jan. 29, 1999 (JP) .......................................... 11-023089

(51) Int. Cl.[7] ........................ H01L 41/04; H01L 41/08; H01L 41/18
(52) U.S. Cl. ....................................... 310/344; 310/340
(58) Field of Search .................. 310/340; 77/344, 77/346, 370

(56) References Cited

U.S. PATENT DOCUMENTS

| | | | | |
|---|---|---|---|---|
| 4,421,621 A | * | 12/1983 | Fujii et al. | 204/192.12 |
| 5,502,344 A | * | 3/1996 | Yoshimoto et al. | 310/344 |
| 5,585,687 A | * | 12/1996 | Wakabayashi et al. | 310/366 |
| 5,920,142 A | * | 7/1999 | Onishi et al. | 310/313 R |
| 6,163,101 A | * | 12/2000 | Yoshida et al. | 310/348 |

* cited by examiner

*Primary Examiner*—Brian Sircus
*Assistant Examiner*—Michael C. Zarroli
(74) *Attorney, Agent, or Firm*—Adams & Wilks

(57) ABSTRACT

A piezoelectric vibrator has a piezoelectric vibration plate having a piezoelectric vibration piece. First and second oscillation electrode films are disposed on the piezoelectric vibration plate for undergoing oscillating movement to vibrate the piezoelectric vibration plate. Each of the first and second oscillation electrode films terminates in a bonding film portion. A pair of cover members form a hermetically sealed cavity containing the piezoelectric vibration piece of the piezoelectric vibration plate. The cover members are anodically bonded together through the bonding film portions of the first and second oscillation electrode films. Each lead electrode of a pair of lead electrodes has a portion connected to a respective one of the bonding film portions of the first and second oscillation electrode films.

11 Claims, 8 Drawing Sheets

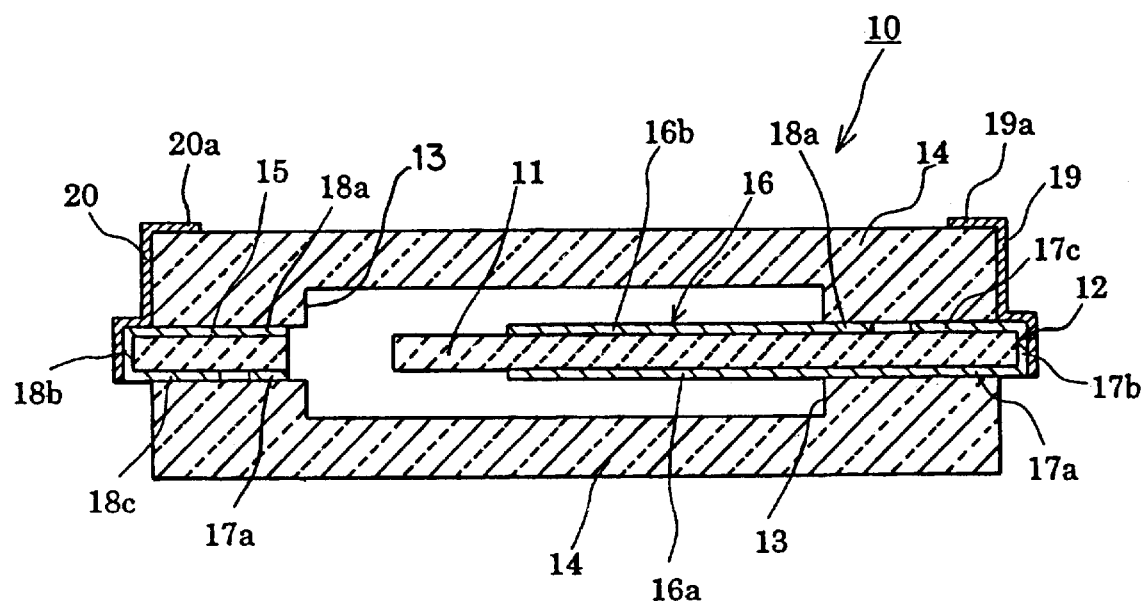
F I G. 2

PIEZOELECTRIC VIBRATOR

BACKGROUND OF THE INVENTION

The present invention relates to a piezoelectric vibrator for use in devices such as portable telephones and portable information terminals.

As a conventional piezoelectric vibrator, there is known, for example, a structure shown in FIG. 8 having oscillation electrode films 63 for vibrating piezoelectric vibration pieces having one end connected to lead electrodes 62 provided on upper and lower surfaces of a piezoelectric vibration plate 61 integrally formed with a piezoelectric vibration piece and a frame portion, and a pair of lid members 66 bonded through bonding materials 64 on the oscillation electrode films 63 and each having a recess 65 defining such a degree of a space as not to prevent vibration of the piezoelectric vibration pieces.

In such a piezoelectric vibrator, generally the oscillation electrode films 63 are respectively extended from different longitudinal ends of the piezoelectric vibration plate 61 to a side surface and connected to lead electrodes 62. This lead electrode 62 is extended to a surface of one lid member 66.

However, in the above construction, a gap occurs between the piezoelectric vibration plate 61 and the lid member 66 at the vicinity of the lengthwise end of the piezoelectric vibration plate 61 on a surface opposite to a side from which the oscillation electrode film 63 extends. Due to this, a space A is formed at an inner side of the lead electrode 62. There is a problem that in this portion the lead electrode 62 is low in strength and hence there is a high possibility of disconnection.

The present invention has been made in view of such a circumstance, and it is an object to provide a piezoelectric vibrator in which the possibility of disconnection of a lead electrode is lowered and its reliability is improved.

SUMMARY OF THE INVENTION

In first form of the invention for solving the object, a piezoelectric vibrator comprises a piezoelectric vibration plate having a piezoelectric vibration piece and a frame portion connected integrally with a base portion thereof and surrounding the piezoelectric vibration piece; a pair of oscillation electrodes provided on opposite surfaces of the piezoelectric vibration plate to vibrate the piezoelectric vibration plate; and a pair of lid members which are bonded through bonding films and which are connected to face each of the oscillation electrodes for hermetically sealing the piezoelectric vibration piece without interfering vibration thereof; the pair of oscillation electrodes has a first electrode formed on a first one of the opposite surfaces of the piezoelectric vibration plate and extending lengthwise to one end of the piezoelectric vibration plate on the first surface, and a second electrode formed on the other of the opposite surfaces of the piezoelectric vibration plate and extending lengthwise to another end of the piezoelectric vibration plate on the second surface; and wherein at least one of the electrodes extends from one of the surfaces to the opposite surface of the piezoelectric vibration plate through a side surface of the end.

In a second form of the invention, the one pair of oscillation electrodes of both electrodes are extended to a surface on an opposite side through an end side surface on an extension side.

In a third form of the invention, the one pair of oscillation electrodes at lengthwise both ends are connected with face to face each lead electrode extended to a surface of the lid member on a side that at least one electrode is extended to a surface on an opposite side of the piezoelectric vibration plate.

In the invention as described above, it is possible to prevent disconnection of the lead electrode.

BRIEF DESCRIPTION OF THE DRAWINGS

FIG. 2 is a sectional view of the quartz crystal resonator according to the one embodiment of the present invention;

DETAILED DESCRIPTION OF THE PREFERRED EMBODIMENTS

Hereunder, the present invention will be explained in detail based on the drawings.

Figure 1:
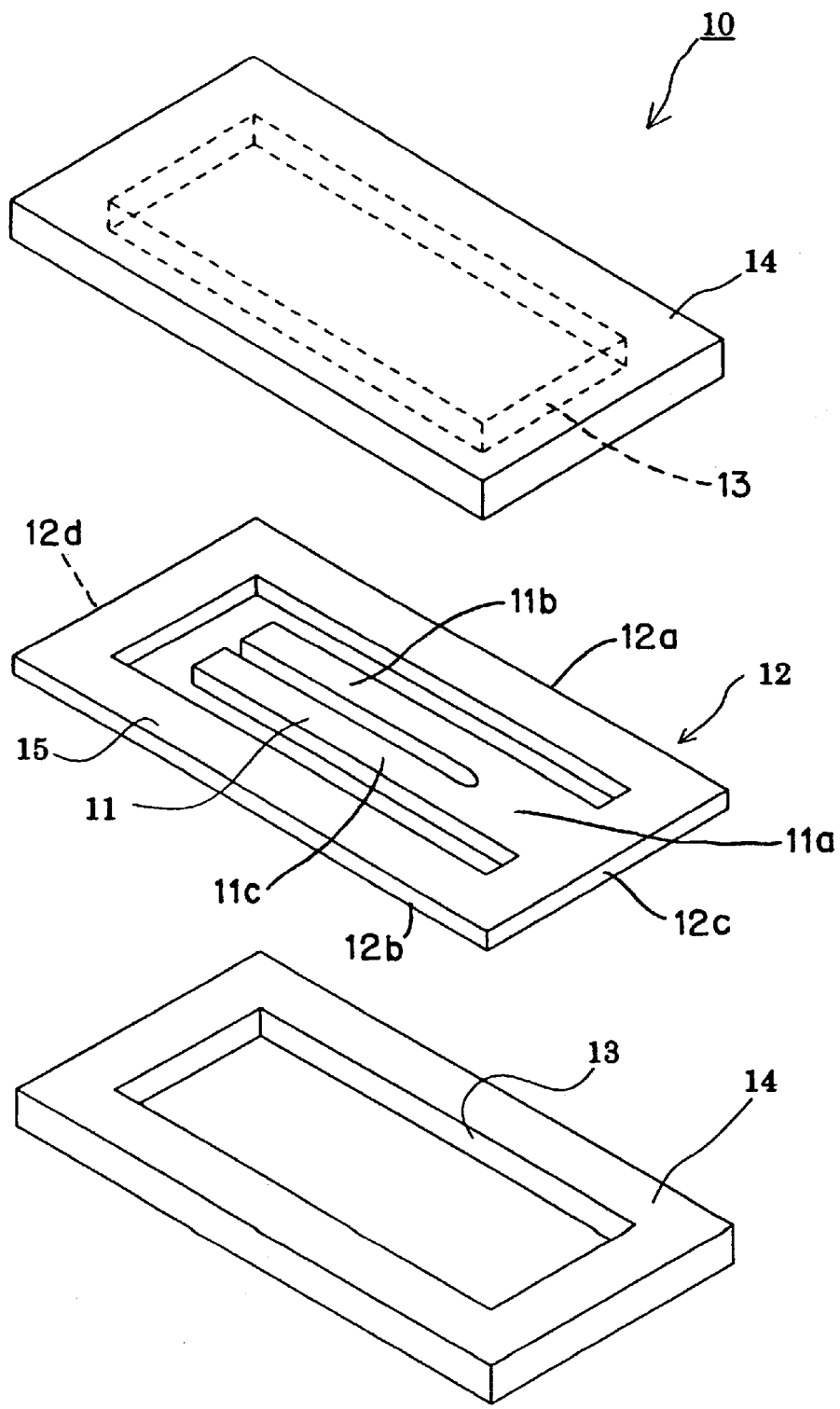
FIG. 1 is an exploded perspective view of a quartz crystal resonator according to one embodiment of the present invention.

FIG. 1 is an exploded perspective view of a piezoelectric vibrator according to one embodiment of the present invention, and FIG. 2 is a sectional view thereof.

A piezoelectric vibrator of the present embodiment is, for example, a quartz crystal resonator 10 having a quartz crystal vibration piece 11 of a tuning-fork type formed of quartz ($SiO_2$) and provided as shown with a quartz crystal plate 12 having the quartz crystal vibration piece 11 and a pair of cover or lid members 14 bonded to respective surfaces of this quartz crystal plate 12 to hermetically seal the quartz crystal vibration piece 11 in a vibratable state.

The vibration piece 11 has a base portion 11a and two vibratory tines 11b, 11c extending from the base portion 11a. The quartz crystal plate 12 of the present embodiment has the tuning-fork type quartz crystal vibration piece 11, opposed main surfaces 12a, 12b, side surfaces 12c, 12d at respective opposite ends, and a frame portion 15 integrally connected with the base portion 11a of and surrounding the quartz crystal vibration piece 11.

The pair of lid members 14 are formed, for example, of soda-lime glass or the like. Each lid member 14 has a recess 13. When the lid members are connected, the recesses 13 define a space or cavity for housing the quartz crystal vibration piece 11 in such an extent as not to prevent vibration of the quartz crystal vibration piece 11.

The quartz crystal plate 12 bonded with the lid members 14, as shown in FIG. 2, has oscillation electrode films 16 formed on the opposite main surfaces and on the side surfaces to vibrate the quartz crystal vibration piece 11, and bonding films 17, 18 formed of a same material as the oscillation electrode films 16 in an area of the main surfaces corresponding to the frame portion 15 and providing actual bonding portions to the lid members 14. The bonding films 17, 18 and the lid members 14 are, although hereinafter described in detail, bonded through so-called anodic bonding, thereby providing a bonding between the quartz crystal plate 12 and the lid members 14.

Each oscillation electrode film 16 formed on the main surfaces of the quartz crystal plate 12 is extended lengthwise to an end of each surface, and in the present embodiment is further extended to a region facing the lid member 14 on an opposite-side surface through respective end side surfaces in a lengthwise direction of the quartz crystal plate 12. That is, in the present embodiment an electrode 16a as one pole of the oscillation electrode film 16 is extended to the end portion on a right end in the figure to become a terminal connection bonding film 17a on the same surface, and further provided continuous to a turning-back portion 17c on an opposite side surface through a connection portion 17b on an end side surface. Meanwhile, an electrode 16b as another pole is extended to an end on a left end in the figure to become a terminal connection bonding film 18a, and provided continuous to a turning-back portion 18c on an opposite side surface through a connection portion 18b on an end side surface. By doing so, at the end portion of the quartz crystal plate 12 usually projecting from the lid members 14, bonding films 17a–17c, 18–18c are provided between the lid member 14 without having gaps which are connected to each electrode 16a, 16b. Accordingly, external connection becomes easy. In the present embodiment, a lead electrode 19 is provided contacting the bonding films 17b, 17c while a lead electrode 20 is provided contacting the bonding films 18b, 18c. Contact portions 19a, 20a are provided in an upper part of the figure.

Incidentally, at least parts of terminal connection bonding films 17a, 18a formed on the respective surfaces of the quartz crystal plate 12 are formed respectively to surround the concave portions 13 on both main surfaces. After bonding, the concave portions 13 are hermetically sealed.

In this manner, in the present embodiment the bonding film 17 formed on each surface of the quartz crystal plate 12 was provided extending from the lengthwise end portion of the quartz crystal plate 12 through the side surface to the region on the opposite side surface facing the lid member 14. Due to this, even if lead electrodes 19, 20 are provided, no spaces will be formed at an inside thereof. The lead electrodes 19, 20 are positively adhered to the bonding film 17b, 17c and 18b, 18c and to the lid member 14. Therefore, it is possible to form a quartz crystal resonator in which the possibility of disconnection of the lead electrodes 19, 20 is significantly lowered, thereby improving reliability.

Figure 3:
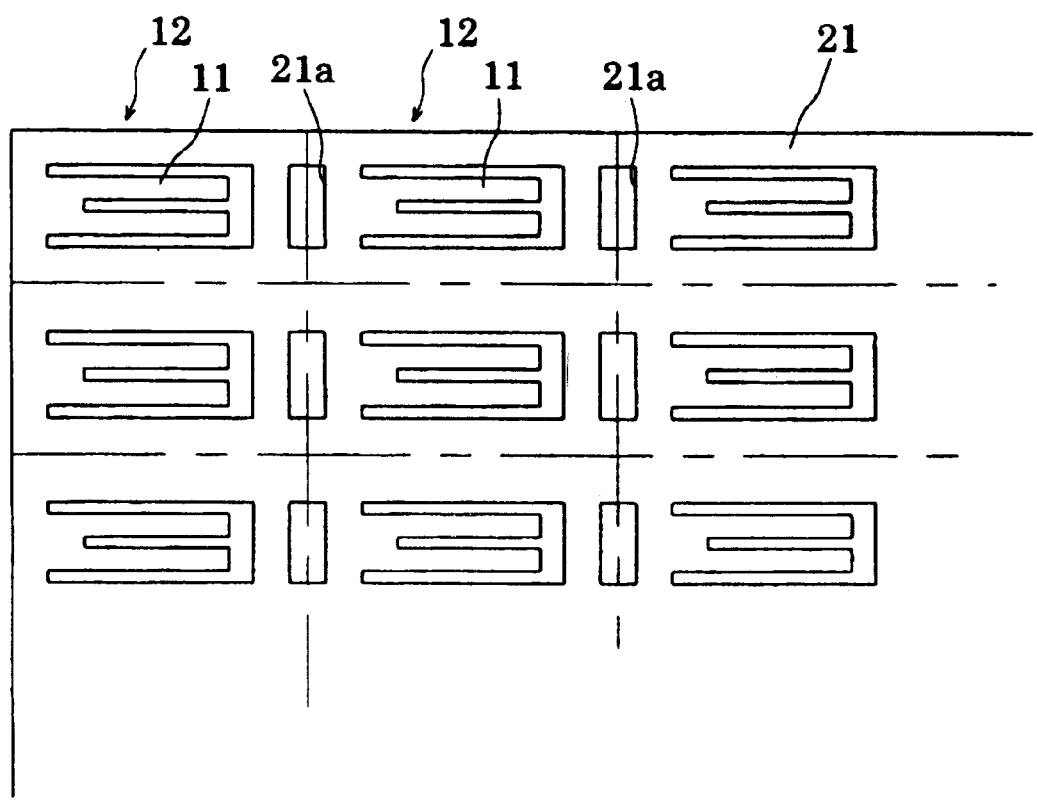
FIG. 3 is a plan view showing a general arrangement of a quartz wafer according to the one embodiment of the present invention.
Figure 4:
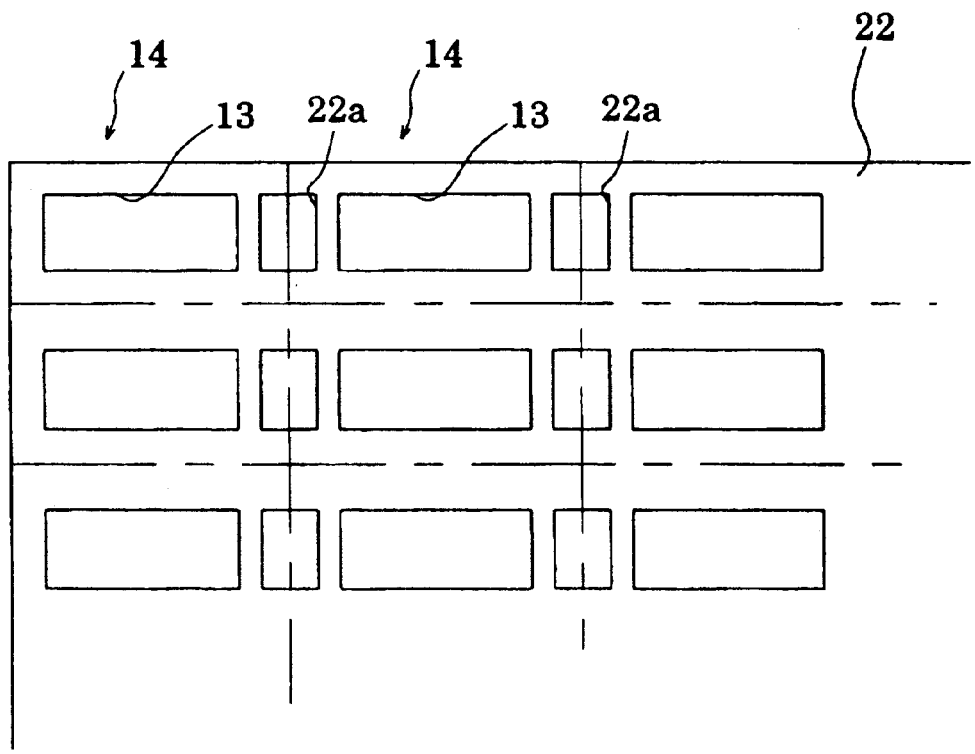
FIG. 4 is a plan view showing a general arrangement of a lid member forming substrate according to the one embodiment of the present invention.

Hereunder, explanation is made on a manufacturing process for such a quartz crystal resonator. Incidentally, FIG. 3 is a plan view showing a quartz wafer according to the present embodiment. FIG. 4 is a plan view showing an outline of a lid member forming substrate according to the present embodiment.

First, as shown in FIG. 3, a quartz wafer 21 having a thickness of, for example, 0.1–0.2 mm is etched to thereby form a plurality of quartz crystal vibration pieces 11 on one quartz wafer 21. That is, a plurality of quartz crystal plates 12 are formed integrally with the quartz wafer 21. Also, at the same time, through-holes 21a are formed between the quartz crystal vibration pieces 11 in a lengthwise direction of the quartz crystal vibration pieces 11. This through-hole 21a has an inner surface to be formed into part of a side surface of a quartz crystal plate 12 after cutting the quartz wafer 21.

Also, as shown in FIG. 4, for example, a lid forming member 22 formed of soda-lime glass is etched to thereby form recesses 13 for the quartz crystal vibration pieces 11 of the quartz wafer 21. That is, a plurality of lid members 14 are formed integrally with the lid forming member 22. Also, at the same time, at corresponding areas of the quartz wafer 21 to the through-holes 21a, through-holes 22a are formed greater than the through-holes 21a. This through-hole 22a has an inner surface to be formed into part of a side surface of the lid member 14.

Figure 5A:
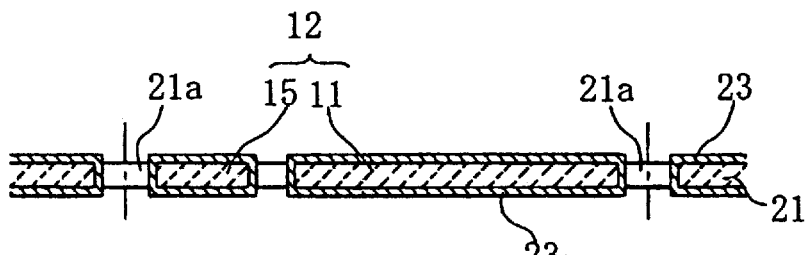
FIG. 5 is a sectional view showing a manufacturing process for a piezoelectric vibrator according to the present invention.

Next, as shown in FIG. 5(a), a metal film 23 is film-formed by sputtering or the like over the entire surface of the quartz wafer 21 thus formed. This metal film 23 is a film to constitute bonding films 17, 18 becoming actual bonding portions to lid forming members 22 and oscillation electrode films 16 for vibrating the quartz crystal vibration pieces 11. The material thereof is not especially limited but preferably uses, for example, chromium, aluminum or the like. In the present embodiment chromium was used.

Figure 5B:
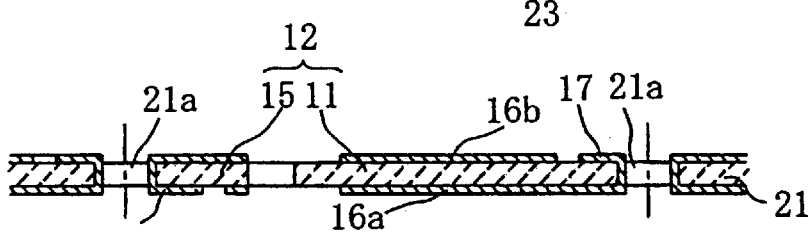

Next, as shown in FIG. 5(b), the metal film 23 is patterned to form oscillation electrode films 16 and bonding films 17 in a peripheral area corresponding to the frame 15.

Figure 5C:
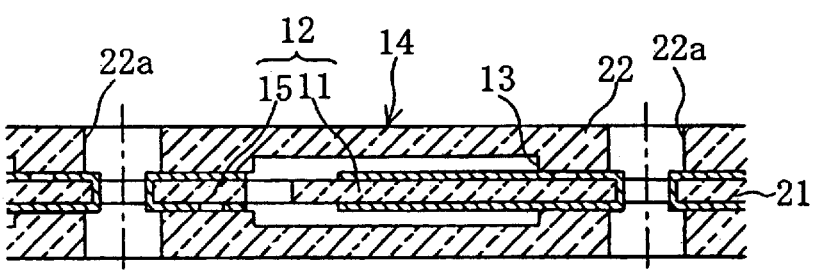

Next, as shown in FIG. 5(c), a pair of lid forming members 22 are bonded onto respective surfaces of the quartz wafer 21 trough the bonding films by anodic bonding in an inert gas or in vacuum, hermetically sealing the quartz crystal vibration pieces 11 in the space formed by the recesses 13. After the anodic bonding, particularly when using soda-lime glass, it is necessary to heat each member to, e.g. 100° C.–150° C., lower than a glass softening point, and apply respective d.c. voltages of 3–5 kV to the bonding films 17, 18 on the respective surfaces of the quartz wafer 21 and to the lid forming member 22 with an anode given on a lid forming member 22 side by a direct current power source. For example, in the present embodiment each member was heated to 120° C. and applied with a direct current voltage of about 3.5 kV, thus performing anodic bonding.

In this manner, by anodically bonding between the quartz crystal plate 12 and the lid members 14 through bonding films 17, 18 under such conditions as the one stated above, the bonding films 17, 18 and the lid members 14 can be well bonded. That is, the quartz oscillation plate 12 and the lid members 14 are well bonded through the bonding films 17, 18, and there is no occurrence of cracking or the like.

Here, quartz as a material of the quartz oscillation plate 12 has a thermal expansion coefficient of 13.7 ppm/°C. Soda-lime glass used as a lid member 14 has a thermal expansion coefficient of 8.5 ppm/°C. That is, the difference between these thermal expansion coefficients is 5.2 ppm/°C. and comparatively large. It is therefore difficult to perform anodic bonding on them under the conventionally-known condition. However, as in the present embodiment, by setting the bonding temperature to a low temperature of about 100–150° C. and applying a comparatively high direct current voltage of about 3–5 kV to perform anodic bonding, the affection of thermal expansion coefficient can be reduced to extremely small. Preferred bonding is possible even for members that are comparatively large in thermal expansion coefficient.

Figure 5D:
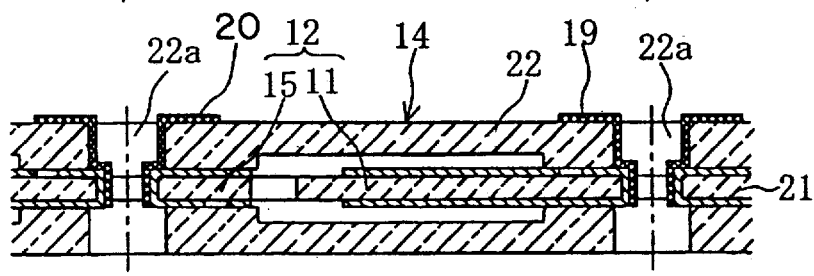

After bonding the quartz wafer 21 and the lid forming members 22 by anodic bonding in this manner, next as shown in FIG. 5(d) a metal film is film-formed over surfaces of the bonding films 17, 18 and one lid member 14 by sputtering or the like which is for example of chromium (Cr) and gold (Au) and the like. Furthermore, this metal film is patterned to form end electrodes 19, 20.

Incidentally, in the case that the bonding films 17, 18 are formed of chromium as in the present embodiment, lead electrodes 19, 20 are easy to form over a surface thereof by sputtering. However, where the bonding films 17, 18 are formed of aluminum, aluminum will be oxidized during patterning the bonding films 17, 18. Accordingly, the lead electrodes 19, 20 are difficult to film-form by sputtering. It is preferred to form, for example, by inverted sputtering or the like.

Figure 5E:
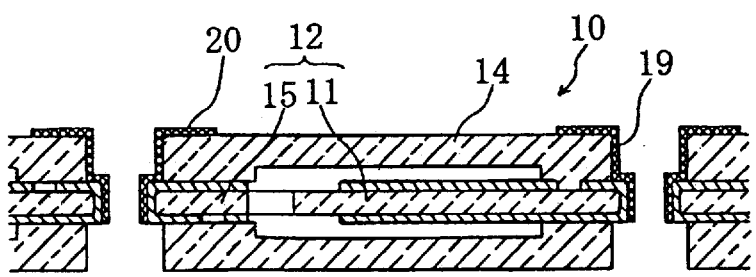

Thereafter, as shown in FIG. 5(e), the quartz wafer 21 and lid forming member 22 are mechanically cut in predetermined positions using a technique of dicing or the like into individual quartz crystal resonators 10.

Figure 6:
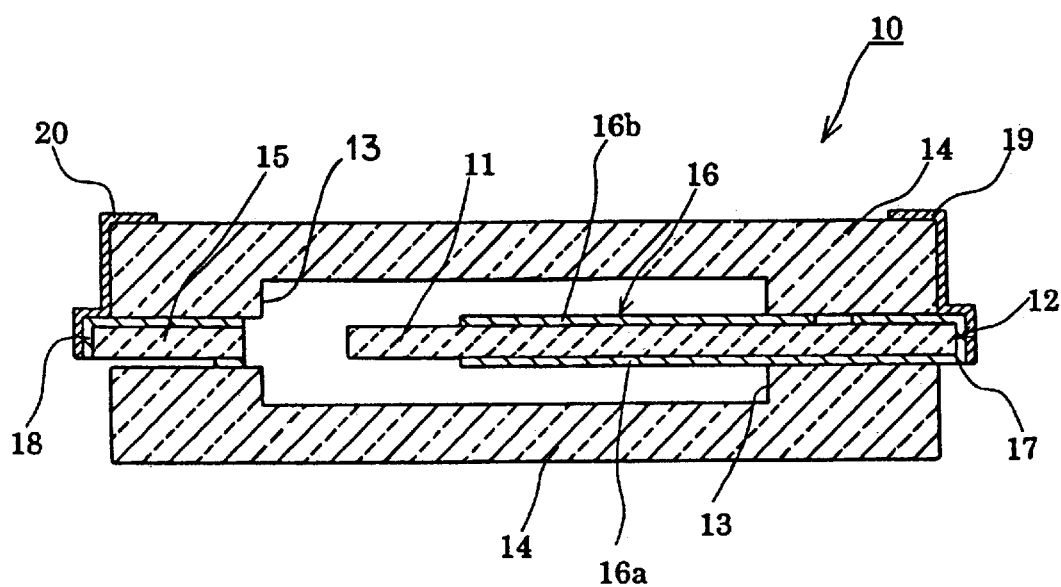
FIG. 6 is a sectional view of a quartz crystal resonator according to another embodiment of the present invention.

Incidentally, in the present embodiment the individual bonding films 17, 18 connected with each oscillation electrode film 16 on both surface of the quartz crystal plate 12 were respectively extended to a surface on an opposite side of the quartz crystal plate 12. However, the invention is not limited to this. For example, as shown in FIG. 6 only the bonding film 17 on one surface side of the quartz crystal plate 12 may be extended to a surface on an opposite side while the bonding film 18 on the other surface side be extended to the side surface of the quartz crystal plate 12. In this case, if the lead electrodes 19, 20 are extended from the bonding films 17, 18 to a lid member 14 surface on a side the bonding film 17 is extended, a similar effect to the one stated above is obtainable.

Figure 7:
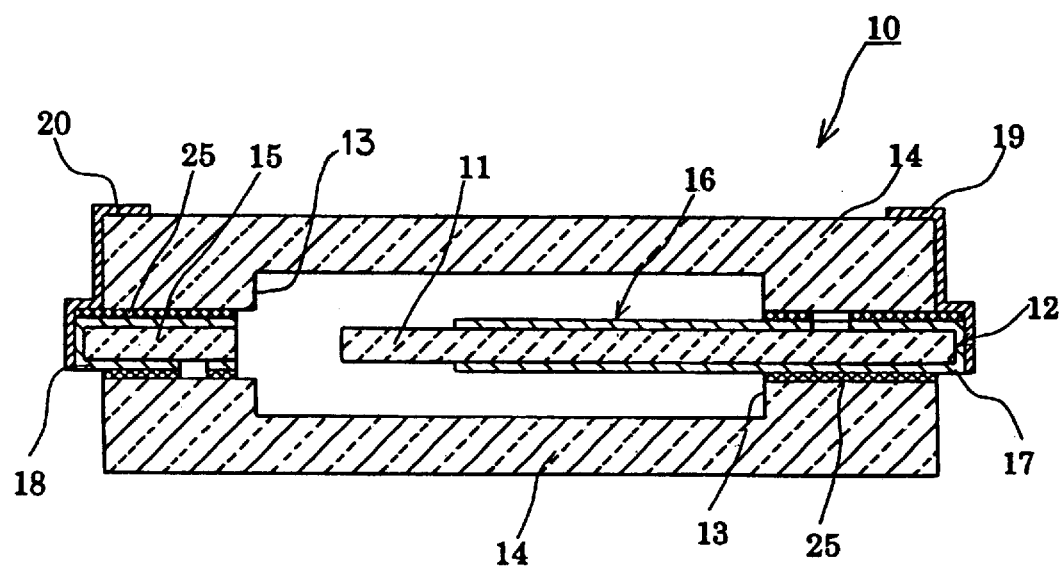
FIG. 7 is a sectional view of a quartz crystal resonator according to another embodiment of the present invention.
Figure 8:
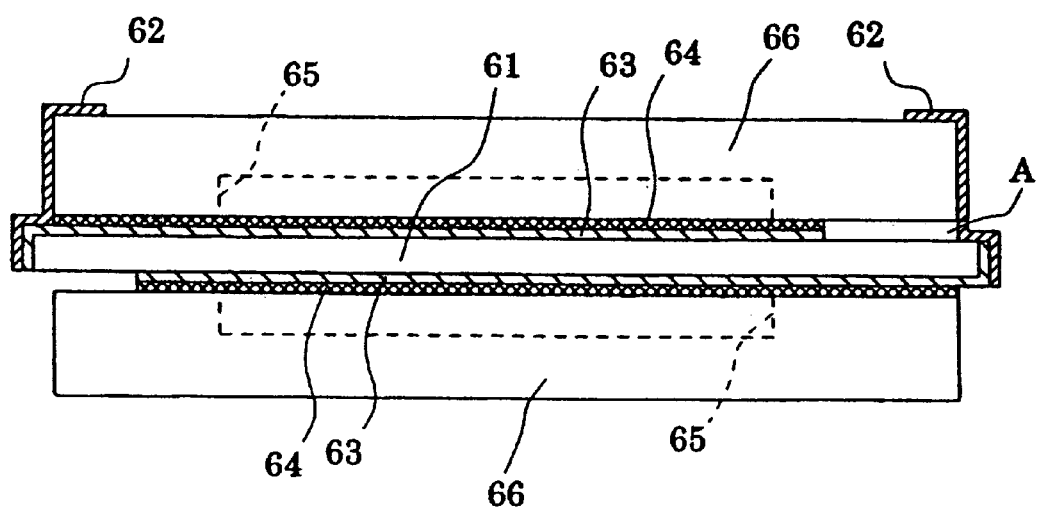
FIG. 8 is a sectional view showing an example of a piezoelectric vibrator according to the prior art.

Also, in the present embodiment, the quartz crystal plate 12 and the lid member 14 were bonded by anodic bonding. However, the invention is not limited to this. For example, as shown in FIG. 7 it is of course possible to bond the quartz crystal plate 12 and the lid member 14, for example, through a bonding member 25 such as low melting point glass. Even with such structure, a similar effect to the above is obtainable by extending the bonding film on at least one surface of the quartz crystal plate 12 to an opposite side of the quartz crystal plate.

As explained above, in the present invention, the oscillation electrode films provided on both main surfaces of the piezoelectric vibration plate are respectively extended to a surface on an opposite side of the piezoelectric vibration plate through a side surface at a lengthwise one end of the piezoelectric vibration plate. Due to this, it is possible to form a lead electrode without defining a space at an inside thereof. Accordingly, the possibility of disconnection of the lead electrode is significantly lowered, thereby improving the reliability of the piezoelectric oscillator.

What is claimed is:

1. A piezoelectric vibrator comprising:
   a piezoelectric vibration plate having first and second opposed main surfaces, a first end having a first side surface, a second end having a second side surface and disposed opposite the first end in a lengthwise direction of the piezoelectric vibration plate, a piezoelectric vibration piece having a base portion, and a frame portion connected with the base portion and surrounding the piezoelectric vibration piece;
   first and second oscillation electrode films disposed on the opposed main surfaces of the piezoelectric vibration plate for undergoing oscillating movement to vibrate the piezoelectric vibration plate, the first oscillation electrode film being disposed on the first main surface of piezoelectric vibration plate and extending in the lengthwise direction toward the first end of the piezoelectric vibration plate, the first oscillation electrode film having a bonding film portion disposed on the first main surface and extending around the first end to the second main surface of the piezoelectric vibration plate, and the second oscillation electrode film being disposed on the second main surface of the piezoelectric vibration plate and extending in the lengthwise direction toward the second end of the piezoelectric vibration plate, the second oscillation electrode film having a bonding film portion extending around the second end and disposed on the first main surface of the piezoelectric vibration plate;
   a pair of cover members anodically bonded together through the bonding film portions of the first and second oscillation electrode films and forming a hermetically sealed cavity containing the piezoelectric vibration piece of the piezoelectric vibration plate in a state in which the piezoelectric vibration piece is capable of undergoing oscillating movement; and
   a pair of lead electrodes disposed on one of the cover members and each having an electrode portion connected to a respective one of the first and second ends of the piezoelectric vibration plate.

2. A piezoelectric vibrator comprising:
   a piezoelectric vibration plate having first and second opposed main surfaces, a first end having a first side surface, a second end having a second side surface and disposed opposite the first end in a lengthwise direction of the piezoelectric vibration plate, a piezoelectric vibration piece having a base portion, and a frame portion connected with the base portion and surrounding the piezoelectric vibration piece;
   first and second oscillation electrode films disposed on the opposed main surfaces of the piezoelectric vibration plate for undergoing oscillating movement to vibrate the piezoelectric vibration plate, the first oscillation electrode film being disposed on the first main surface of piezoelectric vibration plate and extending in the lengthwise direction toward the first end of the piezoelectric vibration plate, the first oscillation electrode film having a bonding film portion disposed on the first main surface and extending around the first end to the second main surface of the piezoelectric vibration plate, and the second oscillation electrode film being disposed on the second main surface of the piezoelectric vibration plate and extending in the lengthwise direction toward the second end of the piezoelectric vibration plate, the second oscillation electrode film having a bonding film portion extending around the second end and disposed on the first main surface of the piezoelectric vibration plate;
   a pair of cover members anodically bonded together through the bonding film portions of the first and second oscillation electrode films and forming a hermetically sealed cavity containing the piezoelectric vibration piece of the piezoelectric vibration plate in a state in which the piezoelectric vibration piece is capable of undergoing oscillating movement; and
   a pair of lead electrodes disposed on one of the cover members and each having an electrode portion connected directly to a respective one of the bonding film portions of the first and second oscillation electrode films.

3. A piezoelectric vibrator comprising:
   a piezoelectric vibration plate having first and second opposed main surfaces, a first end having a first side surface, a second end having a second side surface and disposed opposite to the first end in a lengthwise direction of the piezoelectric vibration plate, a piezoelectric vibration piece, and a frame portion surrounding the piezoelectric vibration piece;

a first oscillation electrode film disposed on the first main surface of the piezoelectric vibration plate and terminating in a bonding portion at the first end of the piezoelectric vibration plate;

a second oscillation electrode film disposed on the second main surface of the piezoelectric vibration plate and terminating in a bonding portion at the second end of the piezoelectric vibration plate;

a pair of cover members forming a hermetically sealed cavity containing the piezoelectric vibration piece of the piezoelectric vibration plate, the cover members being anodically bonded to the frame portion of the piezoelectric vibration plate through the bonding portions of the first and second oscillation electrode films; and a pair of lead electrodes each having a portion connected to a respective one of the bonding portions of the first and second oscillation electrode films.

4. A piezoelectric vibrator according to claim 3; wherein the piezoelectric vibration piece comprises a tuning fork having a base and two vibratory tines extending from the base; and wherein the frame portion extends from the base of the tuning fork and surrounds the vibratory tines.

5. A piezoelectric vibrator according to claim 3; wherein the bonding portion of the first oscillation electrode film is disposed on the first main surface and extends around the first end to the second main surface of the piezoelectric vibration plate.

6. A piezoelectric vibrator according to claim 5; wherein the bonding portion of the second oscillation electrode film is disposed on the second main surface and extends around the second end to the first main surface of the piezoelectric vibration plate.

7. A piezoelectric vibrator according to claim 3; wherein the bonding portion of the second oscillation electrode film is disposed on the second main surface and extends around the second end to the first main surface of the piezoelectric vibration plate.

8. A piezoelectric vibrator comprising:

a piezoelectric vibration plate having a piezoelectric vibration piece;

first and second oscillation electrode films disposed on the piezoelectric vibration plate for undergoing oscillating movement to vibrate the piezoelectric vibration plate, each of the first and second oscillation electrode films terminating in a bonding film portion;

a pair of cover members forming a hermetically sealed cavity containing the piezoelectric vibration piece of the piezoelectric vibration plate, the cover members being anodically bonded together through the bonding film portions of the first and second oscillation electrode films; and a pair of lead electrodes each having a portion connected to a respective one of the bonding film portions of the first and second oscillation electrode films.

9. A piezoelectric vibrator according to claim 8; wherein the piezoelectric vibration piece comprises a tuning fork having a base and two vibratory tines extending from the base; and wherein the piezoelectric vibration plate has a frame portion extending from the base of the tuning fork and surrounding the vibratory tines.

10. A piezoelectric vibrator according to claim 8; wherein the piezoelectric vibration plate has first and second opposed main surfaces, a first end having a first side surface, and a second end having a second side surface and disposed opposite the first end in a lengthwise direction of the piezoelectric vibration plate; and wherein the bonding film portion of the first oscillation electrode film is disposed on the first main surface and extends around the first end to the second main surface of the piezoelectric vibration plate.

11. A piezoelectric vibrator according to claim 10, wherein the bonding film portion of the second oscillation electrode film is disposed on the second main surface and extends around the second end to the first main surface of the piezoelectric vibration plate.

* * * * *